US012593487B2

(12) United States Patent (10) Patent No.: US 12,593,487 B2
Okada et al. (45) Date of Patent: Mar. 31, 2026

(54) TRENCH GATE TYPE IGBT

(71) Applicant: WILL SEMICONDUCTOR (SHANGHAI) CO. LTD., Shanghai (JP)

(72) Inventors: Tetsuya Okada, Saitama (JP); Hiroki Arai, Saitama (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 501 days.

(21) Appl. No.: 18/073,388

(22) Filed: Dec. 1, 2022

(65) Prior Publication Data

US 2024/0120390 A1 Apr. 11, 2024

(30) Foreign Application Priority Data

Oct. 11, 2022 (JP) .................................. 2022163011

(51) Int. Cl.
| | |
|---|---|
| *H10D 64/23* | (2025.01) |
| *H10D 12/00* | (2025.01) |
| *H10D 12/01* | (2025.01) |
| *H10D 62/10* | (2025.01) |
| *H10D 62/17* | (2025.01) |
| *H10D 64/01* | (2025.01) |
| *H10P 74/20* | (2026.01) |

(52) U.S. Cl.
CPC ......... *H10D 64/231* (2025.01); *H10D 12/038* (2025.01); *H10D 12/481* (2025.01); *H10D 62/127* (2025.01); *H10D 62/393* (2025.01); *H10D 64/01* (2025.01); *H10P 74/203* (2026.01)

(58) Field of Classification Search
CPC .. H10D 64/231; H10D 12/038; H10D 12/481; H10D 62/127; H10D 62/393; H10D 64/01; H10D 64/112; H10D 64/117; H10D 12/491; H10D 62/292; H10D 64/512; H10D 64/513; H01L 22/12
USPC ......................................................... 257/139
See application file for complete search history.

(56) References Cited

U.S. PATENT DOCUMENTS

| | | | | |
|---|---|---|---|---|
| 9,076,838 B2 * | 7/2015 | Laven | ................... | H10D 12/035 |
| 2015/0349103 A1 * | 12/2015 | Onozawa | ............. | H10D 62/127 |
| | | | | 257/144 |
| 2016/0020107 A1 | 1/2016 | Miura | | |
| 2017/0236926 A1 * | 8/2017 | Imagawa | ............. | H10D 12/038 |
| | | | | 257/144 |
| 2018/0076193 A1 * | 3/2018 | Shirakawa | ........... | H10D 12/481 |

(Continued)

FOREIGN PATENT DOCUMENTS

| | | |
|---|---|---|
| CN | 107833915 A | 3/2018 |
| CN | 110021657 A | 7/2019 |

(Continued)

*Primary Examiner* — Mohammad M Hoque
(74) *Attorney, Agent, or Firm* — MUNCY, GEISSLER, OLDS & LOWE, P.C.

(57) ABSTRACT

A trench gate type IGBT includes a plurality of trenches, including a plurality of gate trenches having a gate region inside, and a plurality of emitter trenches having an emitter region connected to an emitter electrode. A mesa section adjacent to the trench has a second mesa region, which does not function as a channel; and a contact, which connects the emitter electrode; the second mesa region being sandwiched between the gate trench and the emitter trench.

4 Claims, 8 Drawing Sheets

(56)                    References Cited

U.S. PATENT DOCUMENTS

| | | | |
|---|---|---|---|
| 2018/0083132 A1* | 3/2018 | Dainese ............... | H10D 62/137 |
| 2018/0182875 A1* | 6/2018 | Kanda .................. | H10D 62/106 |
| 2019/0035920 A1 | 1/2019 | Nagata | |
| 2019/0214490 A1* | 7/2019 | Leendertz ............ | H10D 64/513 |

FOREIGN PATENT DOCUMENTS

| | | | |
|---|---|---|---|
| JP | 2003051593 A | | 2/2003 |
| JP | 2017037965 A | * | 2/2017 |
| TW | 200834922 A | | 8/2008 |

* cited by examiner

TRENCH GATE TYPE IGBT

BACKGROUND OF THE INVENTION

1. Field of the Invention

The disclosure relates to a trench gate type IGBT, and in particular, to an improvement of turn-off characteristics.

2. Description of the Related Art

Conventionally, an insulated gate bipolar transistor (IGBT) has been widely used as a switching element of a circuit that drives a high-power motor.

For example, Patent document 1 indicates that in a trench gate type IGBT, a carrier store layer that accumulates holes is arranged on a lower side of a channel of the IGBT.

PRIOR ART DOCUMENTS

Patent Documents

[Patent document 1] Japanese Patent Laid-Open No. 2005-347289

SUMMARY OF THE INVENTION

Problems to be Solved

Here, in a case that the carrier store layer is arranged, a collector-emitter voltage VCE when the IGBT is turned on can be reduced. However, when the IGBT is turned off, the time required for turn-off increases and energy consumption increases due to the influence of remaining holes.

Means to Solve Problems

A trench gate type IGBT according to the disclosure has: a semiconductor substrate; an emitter electrode, which is formed on a surface of the semiconductor substrate; a collector electrode, which is formed on a back surface of the semiconductor substrate; a P-type P-collector layer, which is formed on a back surface side of the semiconductor substrate on the collector electrode; an N-type N-drift layer, which is located on the P-collector layer in the semiconductor substrate; an N-type carrier store layer, which is formed on the N-drift layer and has a higher impurity concentration than the N-drift layer; a P-type P-body layer, which is formed on a surface side of the carrier store layer of the semiconductor substrate; a plurality of gate trenches, which are a plurality of trenches discretely formed with mesa sections interposed therebetween from a surface side of the semiconductor substrate and extending toward a back surface side to the N-drift layer, and have a gate region formed inside with an insulation film therebetween; a plurality of emitter trenches, which are a plurality of trenches discretely formed with mesa sections interposed therebetween from the surface side of the semiconductor substrate and extending toward the back surface side to the N-drift layer, and have an emitter region formed inside with an insulation film therebetween and connected to the emitter electrode; a first mesa region, which is the P-body layer of the mesa section, is connected to the emitter electrode by a contact, and functions as a channel by forming the emitter region on the surface side; and a second mesa region, which is the P-body layer of the mesa section, is connected to the emitter electrode by the contact, and does not function as a channel due to not forming the emitter region on the surface side; the second mesa region being sandwiched between the gate trench and the emitter trench.

The gate trenches and the emitter trenches may be disposed in alignment, and in a case that the gate trench is denoted as G and the emitter trench is denoted as E, the trenches may have a sequence of GGEGEGG.

In addition, a trench gate type IGBT according to the disclosure has: a semiconductor substrate; an emitter electrode, which is formed on a surface of the semiconductor substrate; a collector electrode, which is formed on a back surface of the semiconductor substrate; a P-type P-collector layer, which is formed on a back surface side of the semiconductor substrate on the collector electrode; an N-type N-drift layer, which is located on the P-collector layer in the semiconductor substrate; an N-type carrier store layer, which is formed on the N-drift layer and has a higher impurity concentration than the N-drift layer; a P-type P-body layer, which is formed on a surface side of the carrier store layer of the semiconductor substrate; a plurality of gate trenches, which are a plurality of trenches discretely formed with mesa sections interposed therebetween from a surface side of the semiconductor substrate and extending toward a back surface side to the N-drift layer, and have a gate region formed inside with an insulation film therebetween; a plurality of emitter trenches, which are a plurality of trenches discretely formed with mesa sections interposed therebetween from the surface side of the semiconductor substrate and extending toward the back surface side to the N-drift layer, and have an emitter region formed inside with an insulation film therebetween and connected to the emitter electrode; a first mesa region, which is the P-body layer of the mesa section, is connected to the emitter electrode by a contact, and functions as a channel by forming the emitter region on the surface side; and a second mesa region, which is the P-body layer of the mesa section, is connected to the emitter electrode by the contact, and does not function as a channel due to not forming the emitter region on the surface side; the first mesa region and the second mesa region being sandwiched between the gate trench and the emitter trench.

The gate trenches and the emitter trenches may be disposed in alignment, and in a case that the gate trench is denoted as G and the emitter trench is denoted as E, the trenches may have a sequence of GEGEGEG.

The contact may include: a wiring portion, which extends through a contact hole extending from the emitter electrode to an intermediate part of the P-body layer; and a contact region, which is arranged in the P-body layer at a front end side of the wiring portion and has a high impurity concentration.

Effects

According to the trench gate type IGBT of the disclosure, the time required for turn-off can be shortened and energy consumption during turn-off can be reduced.

PREFERRED EMBODIMENT OF THE PRESENT INVENTION

Embodiments of the disclosure are described hereinafter with reference to the drawings. It should be noted that the following embodiments are not intended to limit the disclosure, and configurations obtained by selectively combining a plurality of examples are also included in the disclosure. "Configuration of IGBT"

Figure 1:
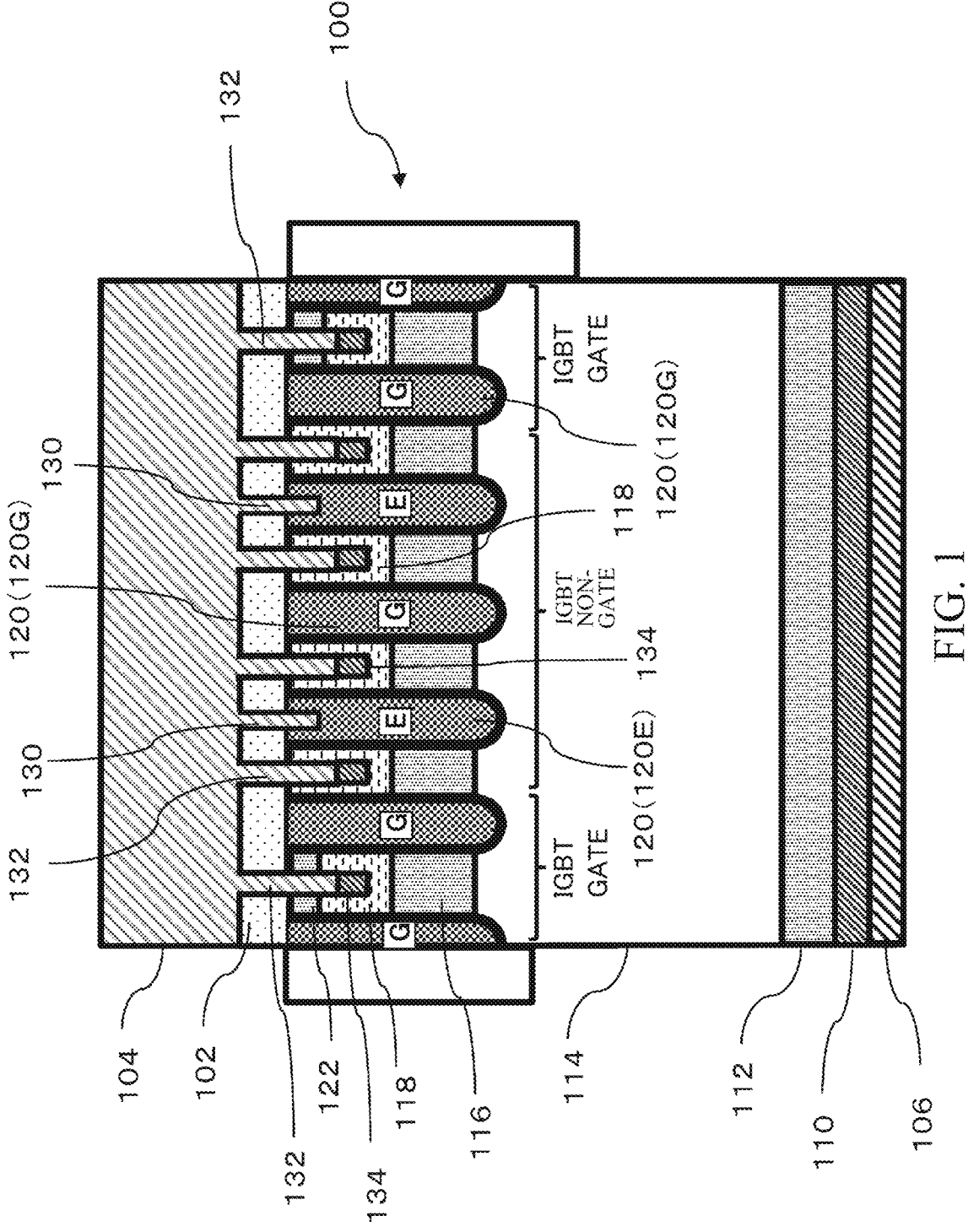
FIG. 1 is a cross-sectional view schematically showing a configuration of a trench gate type IGBT according to an embodiment.

FIG. 1 is a cross-sectional view schematically showing a configuration of a trench gate type IGBT according to an embodiment.

An emitter electrode 104 is formed on a surface of a semiconductor substrate 100 with a correlation insulation film 102 therebetween. For the semiconductor substrate 100, for example, a silicon (Si) wafer such as a floating zone (FZ) wafer is used, but a silicon carbide (SiC) wafer or the like may alternatively be used. For the correlation insulation film 102, an insulating material such as silicon oxide is used. For the emitter electrode 104, a metal material such as aluminum is generally used.

A collector electrode 106 is formed on a back surface of the semiconductor substrate 100. For the collector electrode 106, a metal material such as aluminum is generally used.

A P-collector layer 110 of P+ having a high impurity concentration is formed on a back surface part of the semiconductor substrate on an upper side of the collector electrode 106, and a field stop layer 112 of N+ having a higher impurity concentration than an N-drift layer 114 described later is formed thereon. These N-type and P-type regions in the semiconductor substrate 100 are formed by doping impurities of the respective types. The P-collector layer 110 functions as a collector region, and the field stop layer 112 prevents the expansion of a depletion layer during OFF.

The N-drift layer 114 formed by the semiconductor substrate 100 of N-type is located on the field stop layer 112. The N-drift layer 114 is a body of the semiconductor substrate 100 and functions as a base for a PNP bipolar transistor of the IGBT.

A carrier store layer 116 of NN+ having a higher impurity concentration than the N-drift layer 114 is arranged on the N-drift layer 114. The carrier store layer 116 lowers an ON resistance by accumulating holes and has a function of lowering a VCE during ON.

A P-body layer 118 of P- having a relatively low impurity concentration is arranged on the carrier store layer 116. The P-body layer 118 functions as an emitter of the PNP bipolar transistor.

In addition, a plurality of trenches 120 are formed downward from the surface of the semiconductor substrate 100. The trench 120 extends downward from the surface of the semiconductor substrate 100 (lower side of the correlation insulation film 102) and penetrates the P-body layer 118 and the carrier store layer 116 to reach the N-drift layer 114.

A peripheral wall of the trench 120 is insulated from the surroundings with an insulation film that contains, for example, silicon oxide, and the inside of the trench 120 is filled with conductive polysilicon or the like. In this example, the trench 120 includes: a gate trench 120G, the inside of which is connected to a gate electrode (not shown) to form a gate region; and an emitter trench 120E, which is connected to the emitter electrode 104 to form an emitter region. In the drawings, wiring connecting the gate trench 120G and the gate electrode is schematically shown, and it is shown that a part of the emitter electrode 104 is extended to connect the emitter trench 120E and the emitter electrode 104.

In addition, an emitter region 122 of N+ having a high impurity concentration is formed at an area adjacent to the gate trench 120G on a surface side of the P-body layer 118. The emitter region 122 is electrically connected to the emitter electrode 104. For example, in a part not shown, the correlation insulation film 102 is removed and the emitter electrode 104 and the emitter region 122 are directly connected.

Thereby, a region between the emitter region 122 and the carrier store layer 116 functions as a channel of a field effect transistor (FET), and electrons, serving as carriers, flow from the emitter region to the N-drift layer 114 via the carrier store layer 116 when the FET is turned on.

In addition, a contact 130 extends from the emitter electrode 104 and is connected to the inside of the emitter trench 120E. Similar to the emitter electrode 104, the contact 130 is formed by metal such as aluminum, and after a contact hole has been formed, metal is deposited in the contact hole. Thereby, the emitter electrode 104 and the emitter trench 120E are connected.

In addition, the contact 132 extending from the emitter electrode 104 is disposed in a way of extending to the P-body layer 118 of each mesa section formed between the plurality of trenches 120. Besides, the contact 132 is connected to a high impurity concentration (P+) contact region 134, which is formed inside (in an intermediate part of) the P-body layer 118 of the mesa section. Thus, the emitter electrode 104 is electrically connected to the contact 132 and the contact region 134, and holes accumulated in the N-drift layer 114 during turn-off can be extracted to the emitter electrode via the P-body layer 118.

Here, in the embodiment, the contact region 134 is arranged not only for the P-body layer 118 which has the emitter region 122 formed on a surface part and functions as a channel, but also for the P-body layer 118 which has no emitter region 122 formed on the surface part and does not function as a channel. Both the contact regions 134 arranged in this two cases are connected to the emitter electrode 104 by the contact 132.

Note that the inside of the gate trench 120G is connected to a gate electrode arranged separately, and the insulation film of the peripheral wall of the gate trench 120G functions as a gate insulation film.

In the IGBT shown in FIG. 1, in a case that the gate trench is denoted as G and the emitter trench is denoted as E, an arrangement of the trenches 120 becomes "GGEGEGG" and is thus referred to as a "GGEGEGG sequence".

"Operation of IGBT"

In a state in which a voltage is applied between the collector electrode 106 and the emitter electrode 104 (for example, 400 V to the collector electrode 106 and 0 V to the emitter electrode 104), a positive voltage (for example, 15 V) is applied to the gate trench 120G. It should be noted that the above-described voltage of 400 V applied to the collector electrode 106 is merely an example, and a low voltage such as 10 V may also be applied depending on the application target.

Thereby, an inversion layer is formed in a channel around the gate trench 120G to turn on the FET, and an electron current from the emitter region 122 toward the N-drift layer 114 flows. That is, a P region of the P-body layer 118 causes the gate trench 120G to become "+", and thereby "−" is accumulated at a sidewall of the gate trench 120G, and the channel region is inverted from the P type to the N type, which causes a current to flow here. Thereby, the PNP bipolar transistor is turned on, holes are supplied from the collector side to the N-drift layer 114, and electrons are supplied from the emitter side, to turn on the IGBT. That is, both the holes and the electrons move, and thus a current from the collector electrode 106 toward the emitter electrode 104 flows.

In addition, by the field stop layer 112, the expansion of the depletion layer can be suppressed, and thus an overall thickness can be reduced.

In the IGBT according to the embodiment, not only the gate trench 120G but also the emitter trench 120E is arranged, and a region without the emitter region 122 is arranged on the surface of the P-body layer 118.

That is, a region which is a region of the P-body layer 118 adjacent to the gate trench 120G and has the emitter region 122 existing on a surface side functions as a channel. The region is referred to as a "first mesa region".

Thus, the gate area (the IGBT GATE in FIG. 1) functions as a gate of the IGBT.

On the other hand, the P-body layer 118, which has no emitter region 122 on the surface does not function as a channel even if being adjacent to the gate trench 120G, nor does a region adjacent to the emitter trench 120E function as a channel. The region is referred to as a "second mesa region". Thus, the non-gate area (the IGBT NON-GATE in FIG. 1) does not function as a gate of the IGBT. In the non-gate area, the gate trench 120G and the emitter trench 120E are capacitively coupled. Therefore, referring the IGBT, it can be replaced with a gate-emitter capacitance, and mirror capacitance can be reduced.

In particular, in the embodiment, the gate trench 120G and the emitter trench 120E are alternately arranged in the non-gate region, and thereby the mirror capacitance can be effectively reduced.

Further, the IGBT according to the embodiment has the contact 132, and thereby the connection to the P-body layer 118 which does not function as a channel also becomes possible. When the IGBT is turned off, the holes remaining in the N-drift layer 114 can be early extracted to the emitter electrode 104. Furthermore, the contact 132 is also disposed for the P-body layer 118 which functions as a channel, and the holes can also be extracted during turn-off here. In addition, although the gate trench 120G is disposed in the non-gate area, the holes are likewise extracted from the P-body layer 118 around the gate trench 120G.

In particular, in the mesa section between the gate trench 120G and the emitter trench 120E, the holes are effectively extracted via the contact 132. In a case of G-G and E-E structures, the potential of the mesa section is the same when viewed in a transverse direction, but in a case of G-E, a potential difference is generated in the transverse direction. Thereby, the holes can be effectively extracted.

Configuration of Comparative Example

Figure 2:
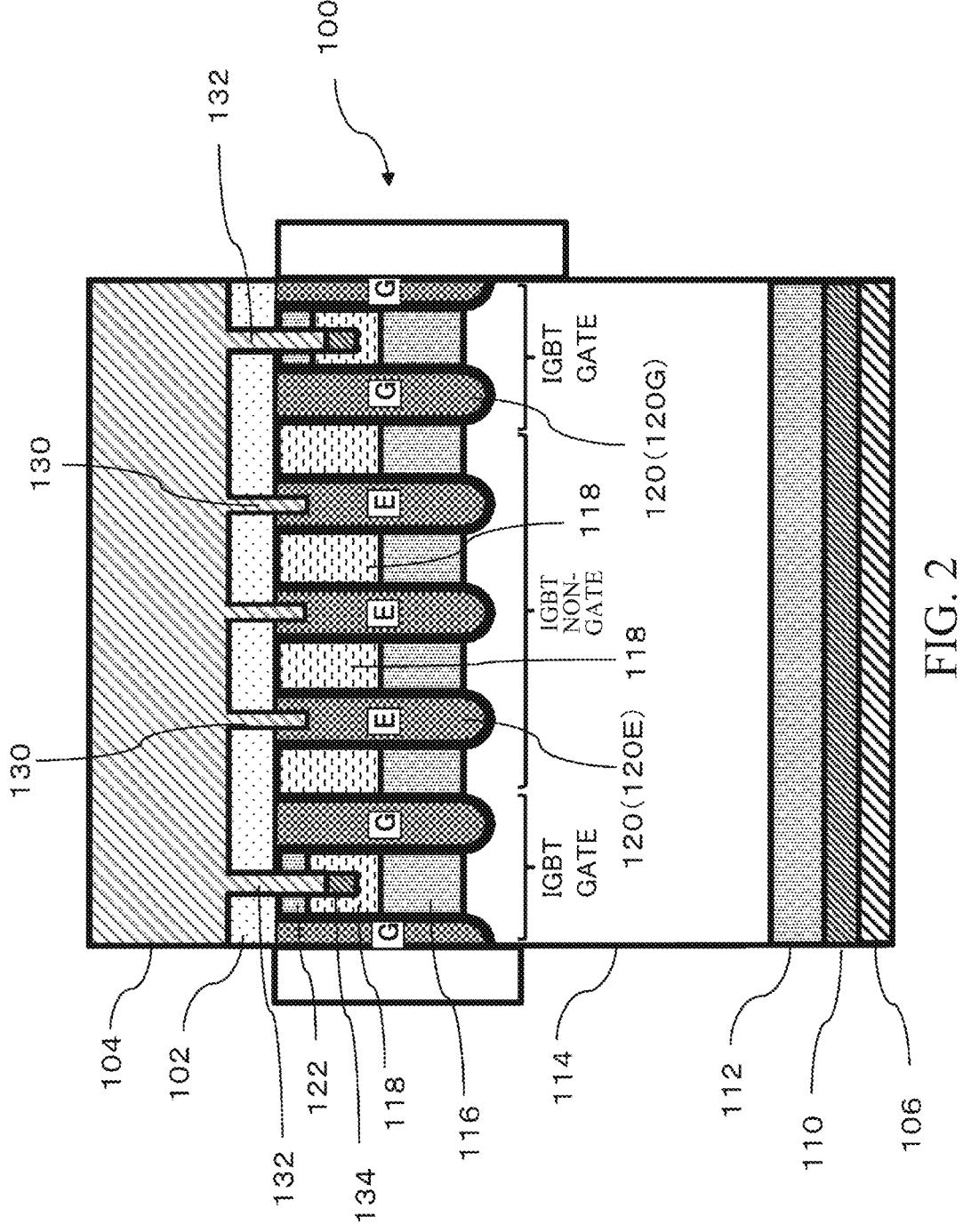
FIG. 2 is a cross-sectional view schematically showing a configuration of a trench gate type IGBT according to a comparative example.

FIG. 2 shows a configuration of a comparative example. In the comparative example, the contact 132 connecting the emitter electrode 104 and the P-body layer 118 is arranged only in a region that functions as a channel in which the emitter region 122 is formed. That is, the contact 132 is not arranged for a mesa section in which the emitter region 122 is not arranged. Thus, the holes cannot be sufficiently extracted during turn-off and there are holes left, which makes the time for turn-off long.

<Characteristics During Turn-Off>

Figure 3:
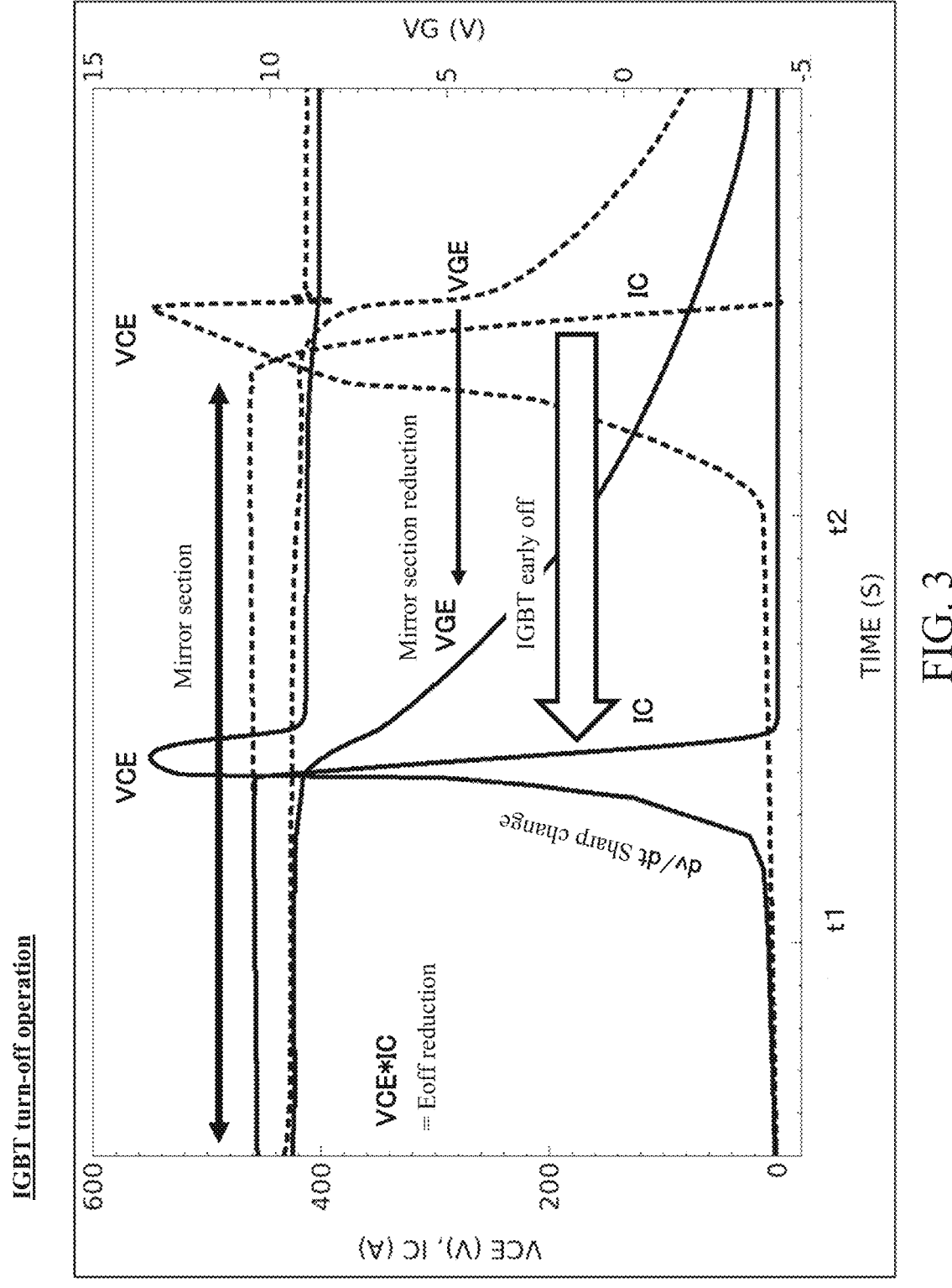
FIG. 3 is a diagram showing current-voltage characteristics during turn-off in the embodiment and the comparative example.

FIG. 3 is a diagram showing current-voltage characteristics during turn-off in the embodiment of FIG. 1 and the comparative example of FIG. 2. The solid lines indicate VCE, VGE, and IC in the embodiment, and the dashed lines indicate VCE, VGE, and IC in the comparative example.

In the comparative example, the collector-emitter voltage VCE begins to rise in the vicinity of Time t2, overshoots and becomes constant. The gate-emitter voltage VGE begins to decrease at the same timing as the VCE exceeds the maximum point. In addition, the collector current IC begins to decrease at the timing when the VCE becomes a power-supply voltage.

On the other hand, in the embodiment, the collector-emitter voltage VCE begins to rise in the vicinity of t1 long before Time t2, overshoots and becomes constant. Here, the slope of the rise in the VCE is large as compared with the comparative example and rises sharply. The gate-emitter voltage VGE begins to decrease also in the vicinity of Time t1 and continues to decrease slowly. The collector current IC decreases sharply in the vicinity of Time t1 and becomes almost zero early.

In the embodiment, the VCE rises sharply and the IC decreases sharply as the holes are quickly extracted from the P-body layer 118.

Energy consumption Eoff during turn-off is Eoff=VCE*IC×time (time from the beginning of the rise in the VCE until the IC is off), and the VCE rises rapidly in the embodiment, thus suppressing the energy consumption to a low level. According to simulation results shown in FIG. 3, power consumption can be reduced by 55%.

In this way, according to the IGBT according to the embodiment, by arranging the emitter trenches or the gate trenches that do not function as a gate of the IGBT, and connecting the P-body layer 118 that does not function as a channel adjacent to the trenches to the emitter electrode or the gate electrode by the contact 132, the holes can be extracted from the P-body layer 118. Therefore, according to the embodiment, turn-off of the IGBT can be carried out at a high speed, and thereby energy consumption during turn-off can be suppressed.

Another Configuration Example

Figure 4:
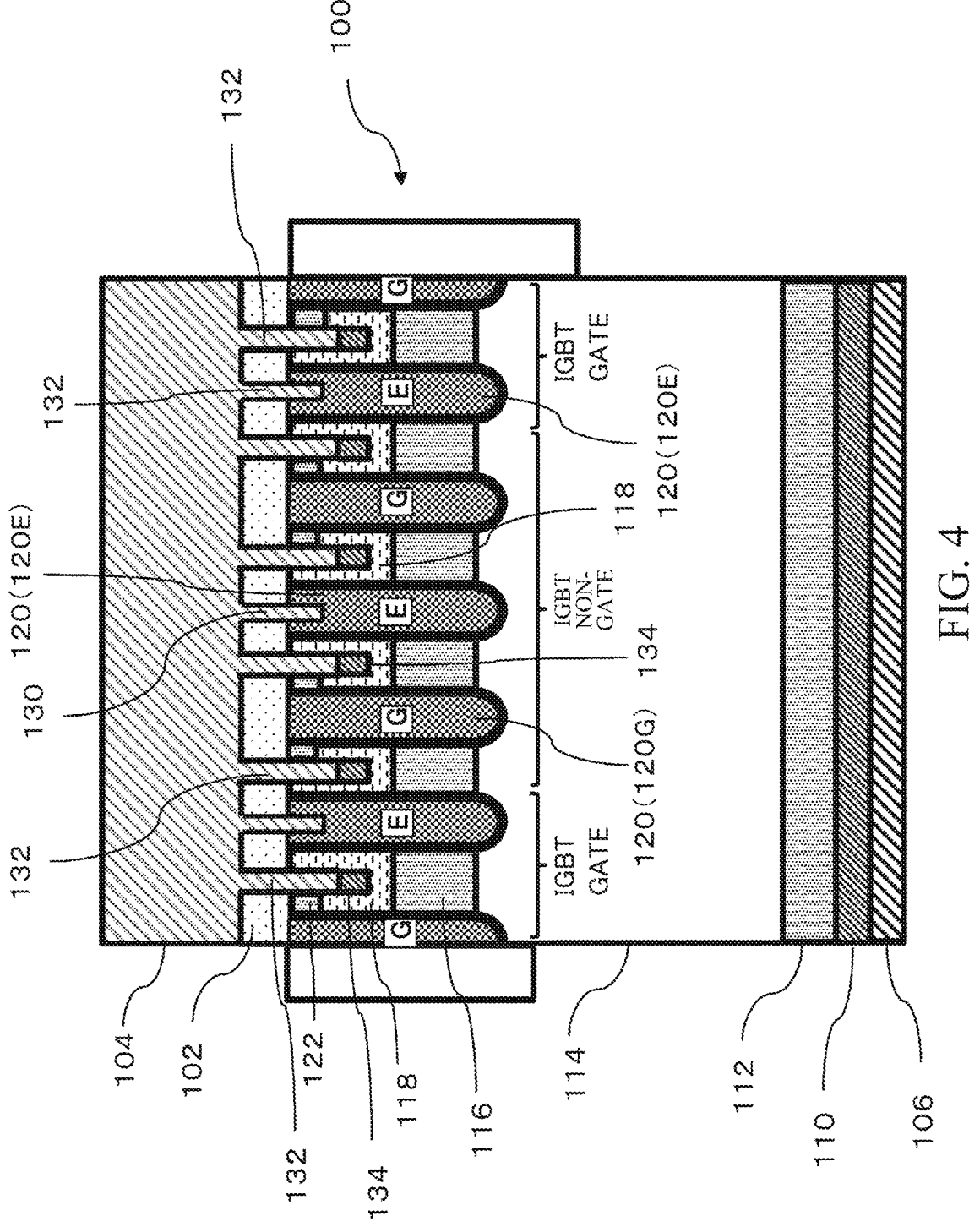
FIG. 4 is a cross-sectional view schematically showing a configuration of a trench gate type IGBT according to another embodiment.

FIG. 4 is a diagram showing a configuration of an IGBT according to another embodiment. In this example, regarding the trenches 120, the gate trench 120G and the emitter trench 120E are alternately arranged. Besides, for all the P-body layers 118 of the mesa sections between the trenches 120, the contact 132 and the contact region 134 are arranged for a connection to the emitter electrode 104.

In the IGBT shown in FIG. 4, in a case that the gate trench is denoted as G and the emitter trench is denoted as E, an arrangement of the trenches 120 becomes "GEGEGEG" and is thus referred to as a "GEGEGEG sequence".

According to this configuration, the holes can also be quickly extracted during turn-off as in the above-described embodiment. In particular, in this embodiment, the channel portion also can make it quicker to extract the holes by setting the structure into a G-E structure in which the gate trench 120G and the emitter trench 120E are opposite to each other.

Figure 5:
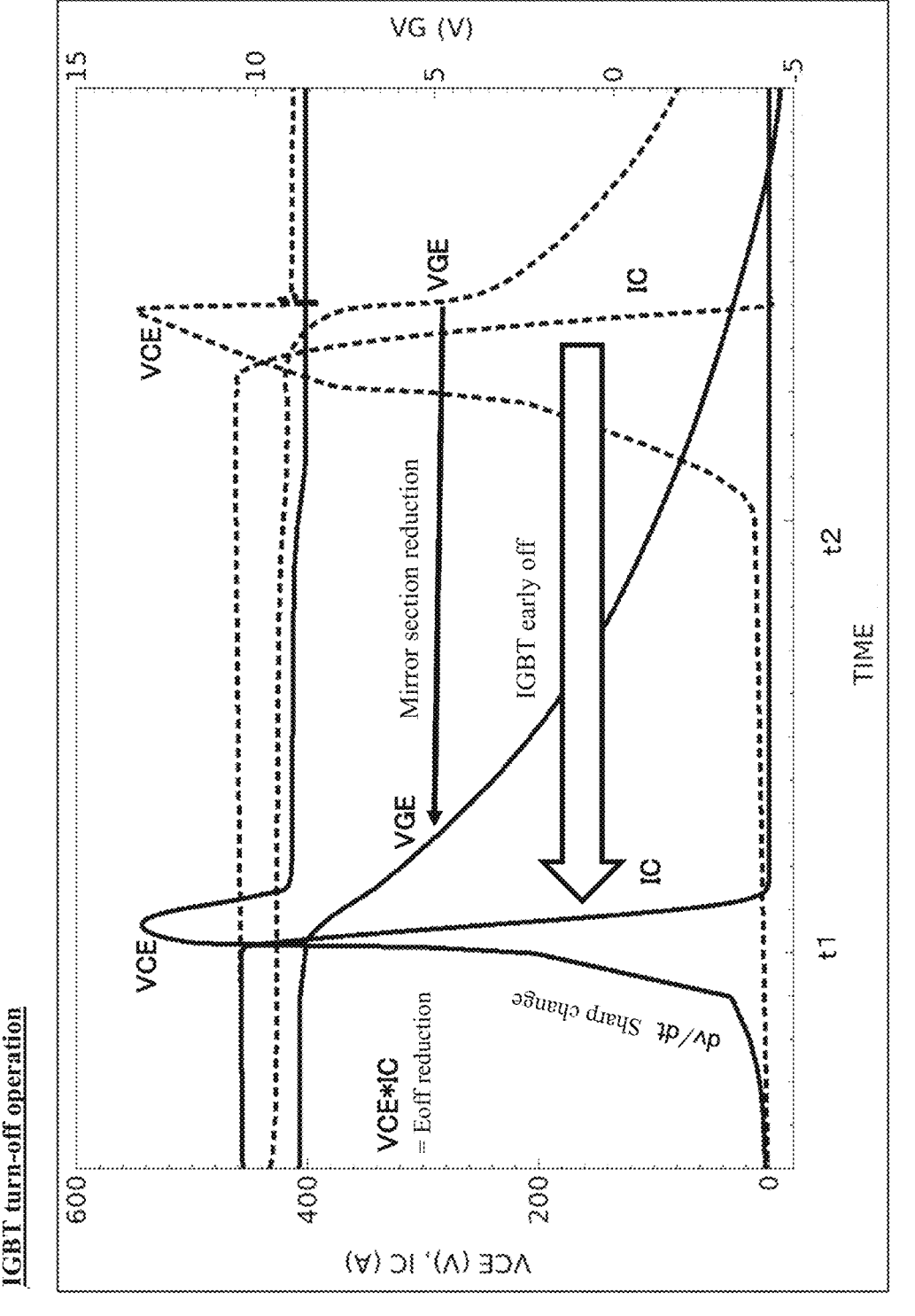
FIG. 5 is a diagram showing current-voltage characteristics during turn-off in the another embodiment and the comparative example.

FIG. 5 is a diagram similar to FIG. 3, and is a diagram showing current-voltage characteristics during turn-off in the embodiment of FIG. 4 and the comparative example of FIG. 2. The solid lines indicate VCE, VGE, and IC in the embodiment of FIG. 4, and the dashed lines indicate the VCE, VGE, and IC in the comparative example.

In this way, according to the configuration of FIG. 5, turn-off of the IGBT is completed earlier. Thereby, power consumption during turn-off can be reduced by 53%.

<G-E Structure>

Figure 6:
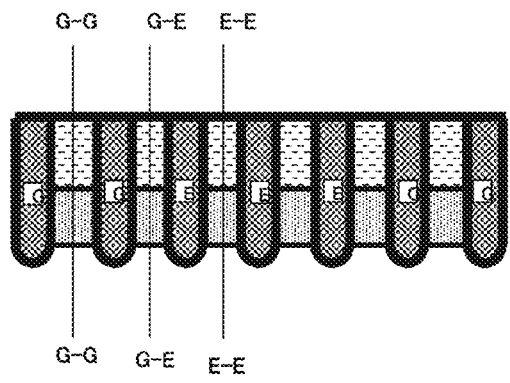
FIG. 6 is a diagram illustrating a cross-sectional position of a mesa section to which a contact is connected.
Figure 7:
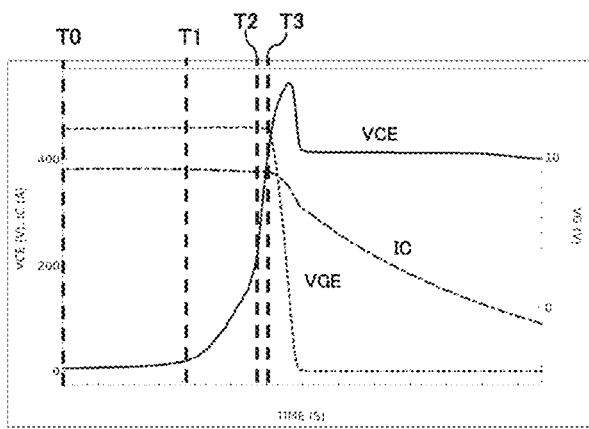
FIG. 7 is a diagram illustrating the time during turn-off.

FIG. 6 to FIG. 10 illustrate hole extraction characteristics based on the arrangement of the gate trench 120G and the emitter trench 120E. FIG. 6 is a diagram illustrating a cross-sectional position of a mesa section to which the contact 132 is connected. A mesa section between the gate trench 120G and the gate trench 120G is denoted as G-G, a mesa section between the gate trench 120G and the emitter trench 120E is denoted as G-E, and a mesa section between the emitter trench 120E and the emitter trench 120E is denoted as E-E. FIG. 7 is a diagram illustrating the time during turn-off, and shows four observation points: beginning of turn-off TO, beginning of hole extraction T1, hole extraction T2, and completion of hole extraction T3.

Figure 8:
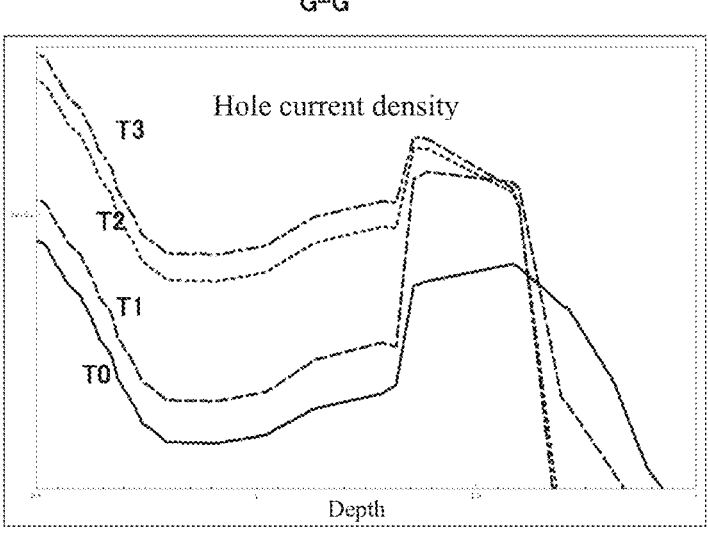
FIG. 8 is a diagram showing hole extraction (hole current density) in a G-G structure.
Figure 9:
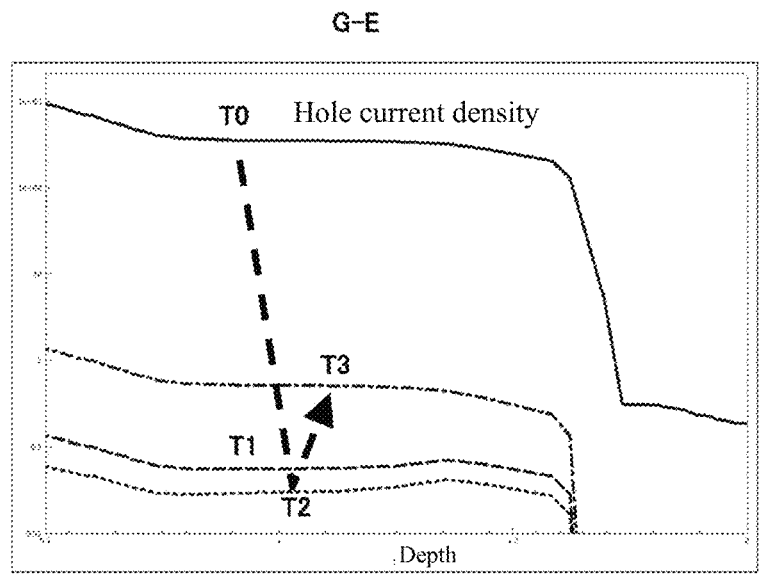
FIG. 9 is a diagram showing hole extraction (hole current density) in a G-E structure.
Figure 10:
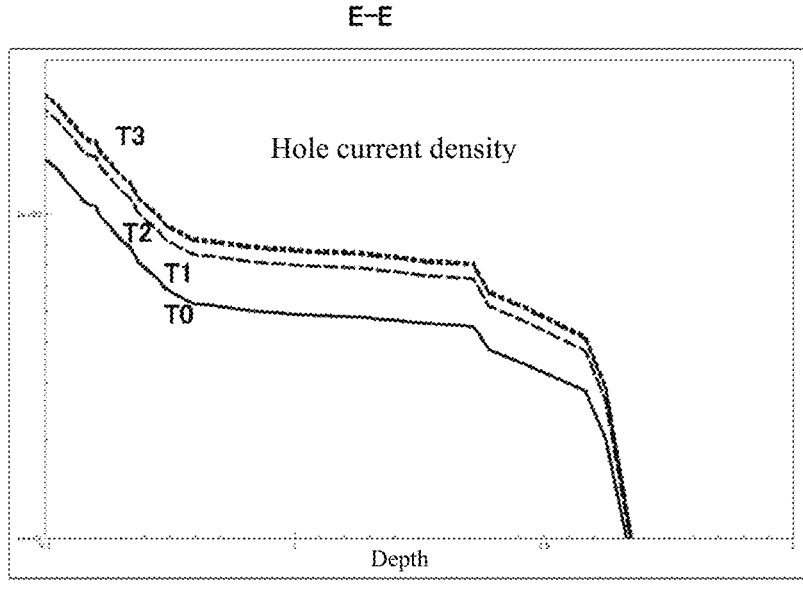
FIG. 10 is a diagram showing hole extraction (hole current density) in an E-E structure.

FIG. 8 is a diagram showing hole extraction (hole current density) in a G-G structure. FIG. 9 is a diagram showing hole extraction (hole current density) in a G-E structure. FIG. 10 is a diagram showing hole extraction (hole current density) in an E-E structure.

In the G-G structure of FIG. 8, a large number of holes are extracted from the contact 132 of the channel portion during turn-off from a steady state.

In the G-E structure of FIG. 9, the accumulated holes are early extracted at an initial stage in a mirror section. Thereafter, the holes of the N-drift layer are extracted again during turn-off.

In the E-E structure of FIG. 10, the holes accumulated on the surface side are not fully extracted even in the mirror section.

In this way, it can be seen that hole extraction during turn-off can be effectively carried out by causing the mesa section to have the G-E structure and connecting the contact 132 to the mesa section.

<Manufacturing Process>

Figure 11:
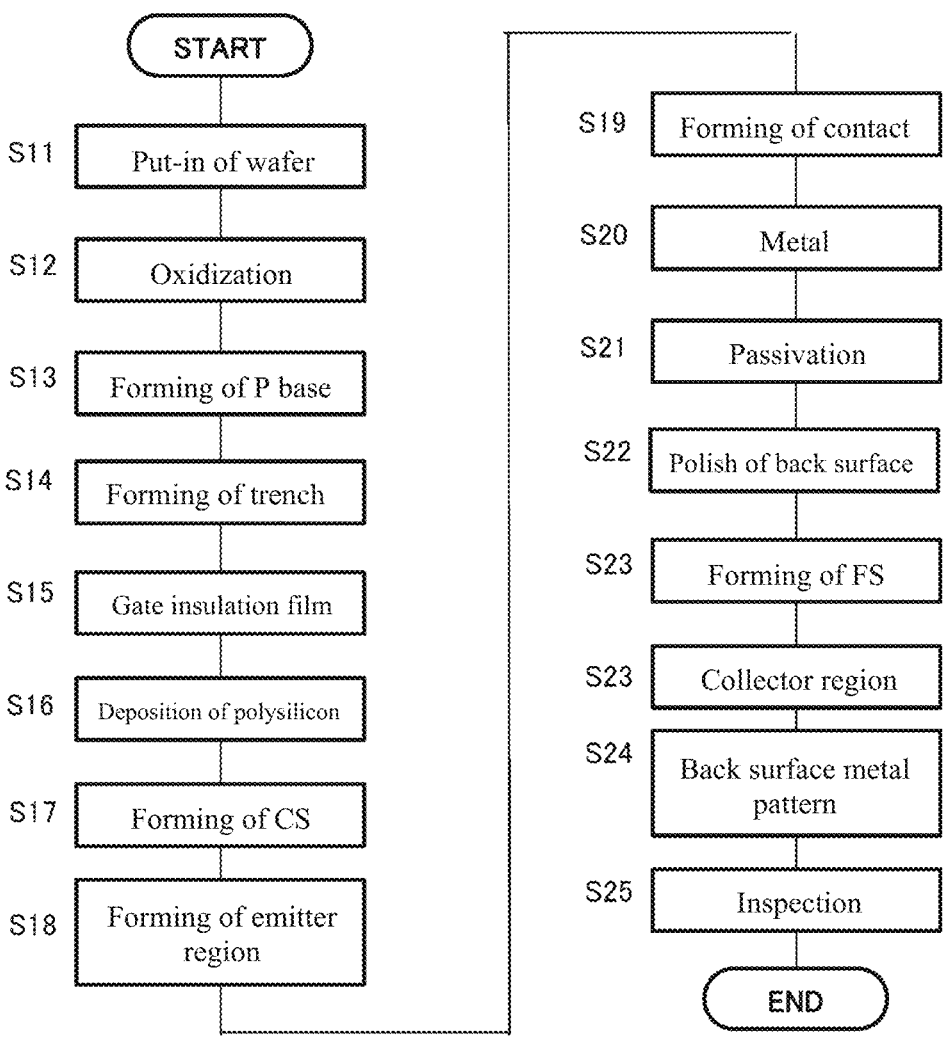
FIG. 11 is a diagram showing a manufacturing process of the IGBT according to the embodiment.

FIG. 11 is a diagram showing a manufacturing process of the IGBT according to the embodiment. First, the semiconductor substrate 100 is prepared and put into the manufacturing process (S11). As the semiconductor substrate 100, for example, an N-type floating zone (FZ) wafer is used.

First, the surface side is oxidized to form the correlation insulation film 102 (S12). Note that a plurality of elements (IGBTs in this case) are produced for one wafer, and thus element separation processing may be carried out at this stage.

Next, the P-body layer 118 of P+ is formed by doping P-type impurities from the surface side (S13). Thereafter, the trench is formed by etching from the surface side (S14), and an oxide film is formed on a wall surface of the formed trench (S15). In a case of the gate trench, the oxide film becomes a gate insulation film. Then, polysilicon is deposited inside the trench (S16). The polysilicon is conductive.

Next, the carrier store layer (CS layer) 116 is formed by implantation of N-type impurities (S17). Then, the emitter region is formed by implanting N-type impurities from the surface side (S18).

The contact hole is formed by etching from the surface side, and the contact region 134 is formed by implantation of P-type impurities (S19). Next, the emitter electrode 104, which also extends into the contact hole, is formed by deposition of metal (S20). Then, the surface side is covered with a passivation film (S21).

Next, the back surface side is polished (S22), and the field stop layer 112 and the P-collector layer 110 are formed sequentially from the back surface side (S23). Then, the collector electrode 106 is formed by deposition of metal (S24).

In this way, the IGBT is formed, then various types of inspections are carried out on the formed IGBT (S25), and the manufacturing process ends.

DESCRIPTION OF THE REFERENCE NUMERALS

100 semiconductor substrate
102 correlation insulation film
104 emitter electrode
106 collector electrode
110 P-collector layer
112 field stop layer
114 N-drift layer
116 carrier store layer
118 P-body layer
120 trench
120E emitter trench
120G gate trench
122 emitter region
132 contact
134 contact region

What is claimed is:

1. A trench gate type IGBT, having:
   a semiconductor substrate;
   an emitter electrode, which is formed on a surface of the semiconductor substrate and an insulation film, the insulation film arranged between the emitter electrode and the semiconductor substrate;
   a collector electrode, which is formed on a back surface of the semiconductor substrate;
   a P-type P-collector layer, which is formed on a back surface side of the semiconductor substrate on the collector electrode;
   an N-type N-drift layer, which is located on the P-type P-collector layer in the semiconductor substrate;
   an N-type carrier store layer, which is formed on the N-type N-drift layer and has a higher impurity concentration than the N-type N-drift layer;
   a P-type P-body layer, which is formed on a surface side of the N-type carrier store layer of the semiconductor substrate so that a PN junction is formed between the P-type P-body layer and the N-type carrier store layer;
   a plurality of gate trenches, which are a plurality of trenches discretely formed with mesa sections interposed therebetween from a surface side of the semiconductor substrate and extending toward a back surface side to the N-type N-drift layer, and have a gate portion formed inside with an insulation film therebetween, wherein the plurality of gate trenches includes first gate trenches arranged in a gate area of the trench gate type IGBT and second gate trenches arranged in a non-gate area of the trench gate type IGBT;

a plurality of emitter trenches, which are a plurality of trenches discretely formed with mesa sections interposed therebetween from the surface side of the semiconductor substrate and extending toward the back surface side to the N-type N-drift layer, and each has a first contact formed inside, the first contact directly connecting to the emitter electrode and extending through the insulation film;

an emitter region, which is adjacent to one of the first gate trenches of the plurality of gate trenches, is formed on a surface side of the P-type P-body layer, and is electrically connected to the emitter electrode;

a first mesa region, which is the P-type P-body layer of the mesa section in the gate area of the trench gate type IGBT, is connected to the emitter electrode by a second contact, and functions as a channel by forming the emitter region on the surface side of the semiconductor substrate, wherein the emitter region is arranged between the first mesa region and the emitter electrode; and a second mesa region, which is the P-type P-body layer of the mesa section in the non-gate area of the trench gate type IGBT, is connected to the emitter electrode by the first contact, and does not function as a channel due to not forming the emitter region on the surface side of the semiconductor substrate;

wherein, in the non-gate area of the trench gate type IGBT, one of the second gate trenches is arranged between successive emitter trenches and the one of the second gate trenches and the emitter trenches are capacitively coupled.

2. The trench gate type IGBT according to claim 1, wherein the plurality of gate trenches and the plurality of emitter trenches are disposed in alignment, and in a case that the gate trench is denoted as G and the emitter trench is denoted as E, the plurality of gate trenches and the plurality of emitter trenches have a sequence of GGEGEGG.

3. The trench gate type IGBT according to claim 1, wherein the first contact comprises: a wiring portion, which extends through a contact hole extending from the emitter electrode to an intermediate part of the P-type P-body layer; and a contact region, which is arranged in the P-type P-body layer at a front end side of the wiring portion and has a high impurity concentration.

4. The trench gate type IGBT according to claim 1, wherein the N-type carrier store layer in the gate area of the trench gate type IGBT and in the non-gate area of the trench gate type IGBT is formed in same process of by implantation of N-type impurities, and the N-type N-drift layer between the N-type carrier store layer and the P-type P-collector layer below the gate area and the non-gate area of the trench gate type IGBT is integrated.

* * * * *